(12) United States Patent
Davison et al.

(10) Patent No.: US 6,524,116 B2
(45) Date of Patent: Feb. 25, 2003

(54) INTERLOCKING SOCKET BASE FOR AN INTEGRATED CIRCUIT PACKAGE

(75) Inventors: Peter A. Davison, Sumner; Michael T. Crocker, Tacoma, both of WA (US)

(73) Assignee: Intel Corporation, Santa Clara, CA (US)

( * ) Notice: Subject to any disclaimer, the term of this patent is extended or adjusted under 35 U.S.C. 154(b) by 40 days.

(21) Appl. No.: 09/888,266

(22) Filed: Jun. 19, 2001

(65) Prior Publication Data

US 2001/0051449 A1 Dec. 13, 2001

Related U.S. Application Data

(63) Continuation of application No. 09/369,496, filed on Aug. 5, 1999, now Pat. No. 6,264,478.

(51) Int. Cl.[7] ............................................. H01R 12/00
(52) U.S. Cl. ....................................................... 439/70
(58) Field of Search ........................... 439/70, 71, 683, 439/686, 717; 361/735, 784

(56) References Cited

U.S. PATENT DOCUMENTS

| | | | | |
|---|---|---|---|---|
| 4,368,939 A | * | 1/1983 | Foederer | 439/594 |
| 5,616,962 A | * | 4/1997 | Ishikawa et al. | 257/777 |
| 5,623,395 A | * | 4/1997 | Derouiche et al. | 361/735 |
| 6,012,929 A | * | 1/2000 | Matsumura | 439/70 |
| 6,264,478 B1 | * | 7/2001 | Davison et al. | 439/70 |

* cited by examiner

*Primary Examiner*—Brian Sircus
*Assistant Examiner*—Brian S. Webb
(74) *Attorney, Agent, or Firm*—Blakely, Sokoloff, Taylor & Zafman LLP

(57) ABSTRACT

A socket for an electronic assembly. The socket may include a first finger that is coupled to a second finger. The socket may further have a plurality of contacts that are located within contact openings of the first and second fingers. The fingers may be separated by spaces that reduce the effective coefficient of thermal expansion.

19 Claims, 3 Drawing Sheets

INTERLOCKING SOCKET BASE FOR AN INTEGRATED CIRCUIT PACKAGE

This application is a continuation of U.S. patent application Ser. No. 09/369,496 filed Aug. 5, 1999 now U.S. Pat. No. 6,264,478.

BACKGROUND OF THE INVENTION

1. Field of the Invention

The present invention relates to a socket that can be attached to a motherboard and be mated with an integrated circuit package.

2. Background Information

Integrated circuits are typically assembled into packages that are mounted to a printed circuit board. The printed circuit board may be a motherboard of a computer. The integrated circuit package can be plugged into a socket mounted to the motherboard. The socket typically has a plurality of contacts that are soldered to the motherboard and which can receive corresponding pins of the integrated circuit package. The socket contacts may be solder balls that are soldered to corresponding surface pads of the motherboard. Surface mount solder ball interconnects are preferred when integrated circuit packages are to be soldered to both sides of the motherboard. Additionally, surface mounting increases the routing density of the board. The integrated circuit package is plugged into the motherboard by inserting the pins of the package into the contacts of the socket.

The contacts are integrated into a dielectric base of the socket. The base is typically constructed from a molded fiber filled resin material. The fibers typically become aligned in the direction of flow during the molding process. The resultant socket may have a non-uniform coefficient of thermal expansion ("CTE"). For example, when a liquid crystal polymer ("LCP") resin is employed the socket may have a CTE of 10–15 parts per million per degrees centigrade ("ppm/° C.") in the direction that the fibers are oriented, and a CTE of 50–60 ppm/° C. in a direction normal to the fiber orientation. The motherboard may be constructed from a material that has a CTE of 15–17 ppm/° C. Variations in temperature will cause the socket to expand/contract at a different rate than the motherboard particularly in the direction normal to the fiber orientation. The differential expansion may cause failures at the solder joints of the motherboard and socket contacts.

Some sockets contain a mineral filler to minimize the CTE in the cross flow direction. The mineral filler is difficult to mold and increases the cost of producing the socket. There have also been attempts at integrating stress relief holes in the socket, but such a solution reduces the structural integrity of the part. It would be desirable to reduce the thermal expansion of an integrated circuit socket in the direction normal to fiber orientation without significantly increasing the cost or reducing the structural integrity of the socket.

The socket is typically molded by injecting the resin through a gate. The resin will typically flow from the gate in a radial manner. The radial flow creates a non-uniform CTE throughout the socket. It would be desirable to provide a socket that will increase the uniformity and predictability of the CTE throughout the socket.

SUMMARY OF THE INVENTION

One embodiment of the present invention is a socket for an electronic assembly. The socket may include a first finger that is coupled to a second finger. The socket may further have a plurality of contacts that are coupled to the first and second fingers.

DETAILED DESCRIPTION

Figure 1:
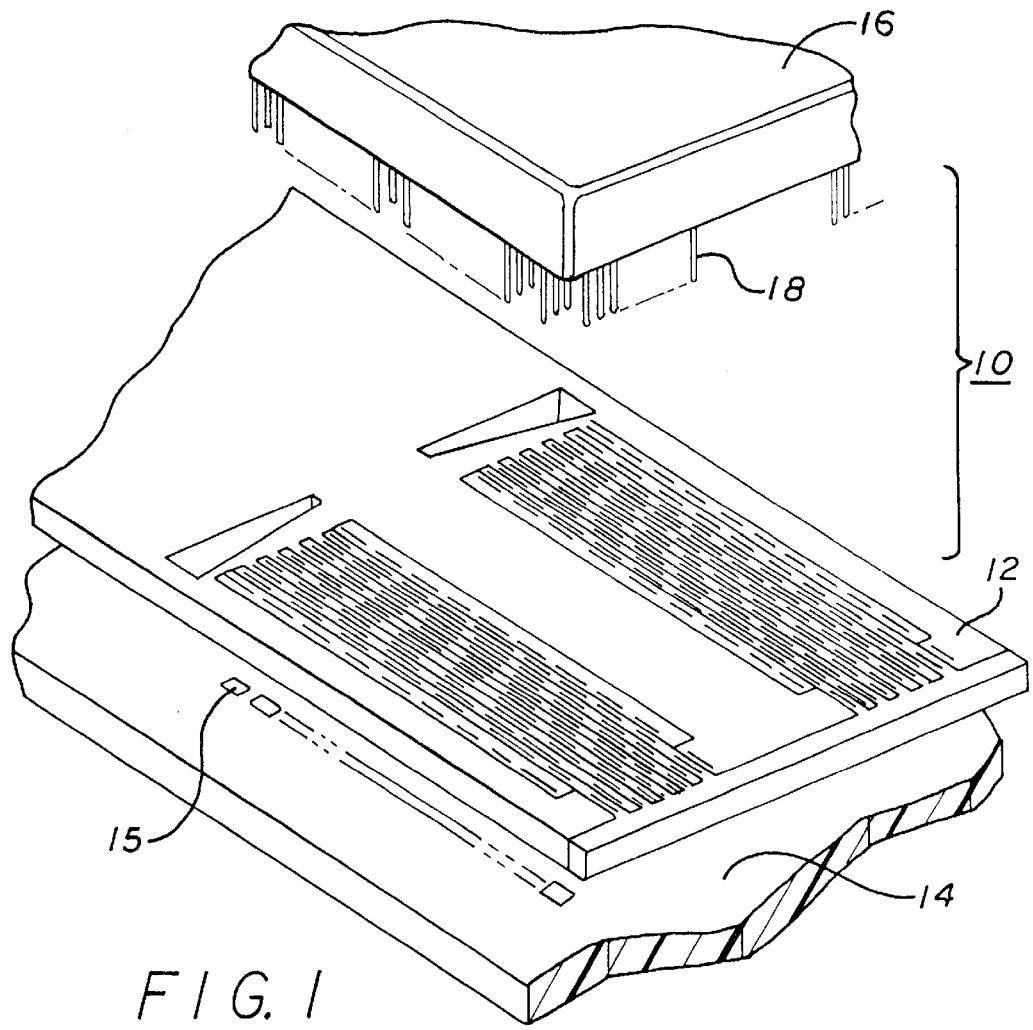
FIG. 1 is a perspective view of an embodiment of an electronic assembly of the present invention.

Referring to the drawings more particularly by reference numbers, FIG. 1 shows an embodiment of an electronic assembly 10 of the present invention. The assembly 10 may include a socket 12 that is mounted to a printed circuit board 14. The printed circuit board 14 may be the motherboard of a computer system. The socket 12 may be mounted to the circuit board 14 by solder balls (not shown) that are reflowed onto corresponding surface pads 15 of the board 14. The solder balls may be arranged in a ball grid array (BGA) pattern.

An integrated circuit package 16 may be plugged into the socket 12 and coupled to the printed circuit board 14. The package 16 may contain an integrated circuit (not shown) that is electrically connected to a plurality of external pins 18. The pins 18 can be inserted into the socket 12 to connect the integrated circuit to the printed circuit board 14.

Figure 2:
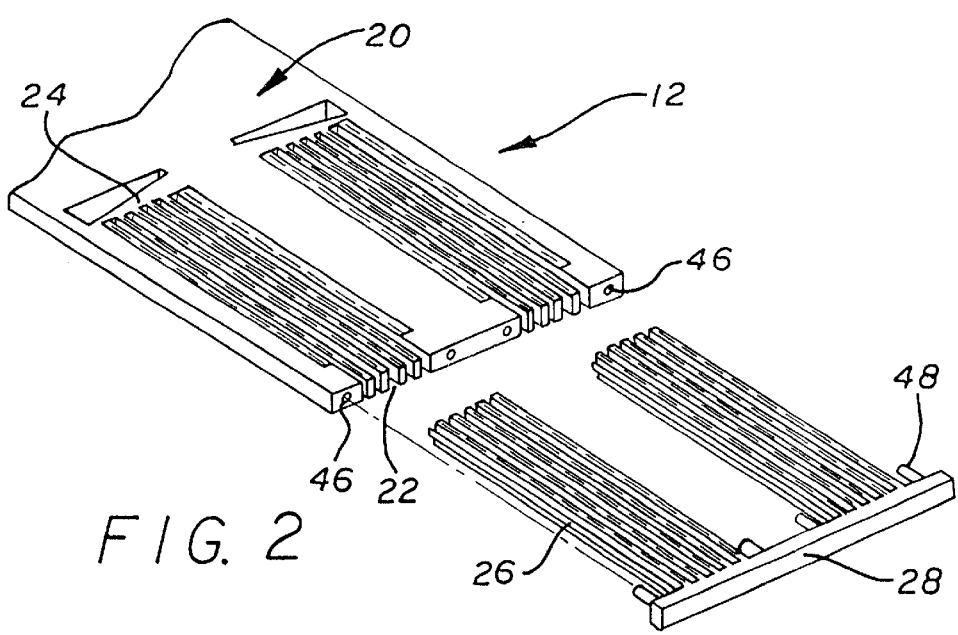
FIG. 2 is an exploded view of a socket of the assembly.
Figure 3:
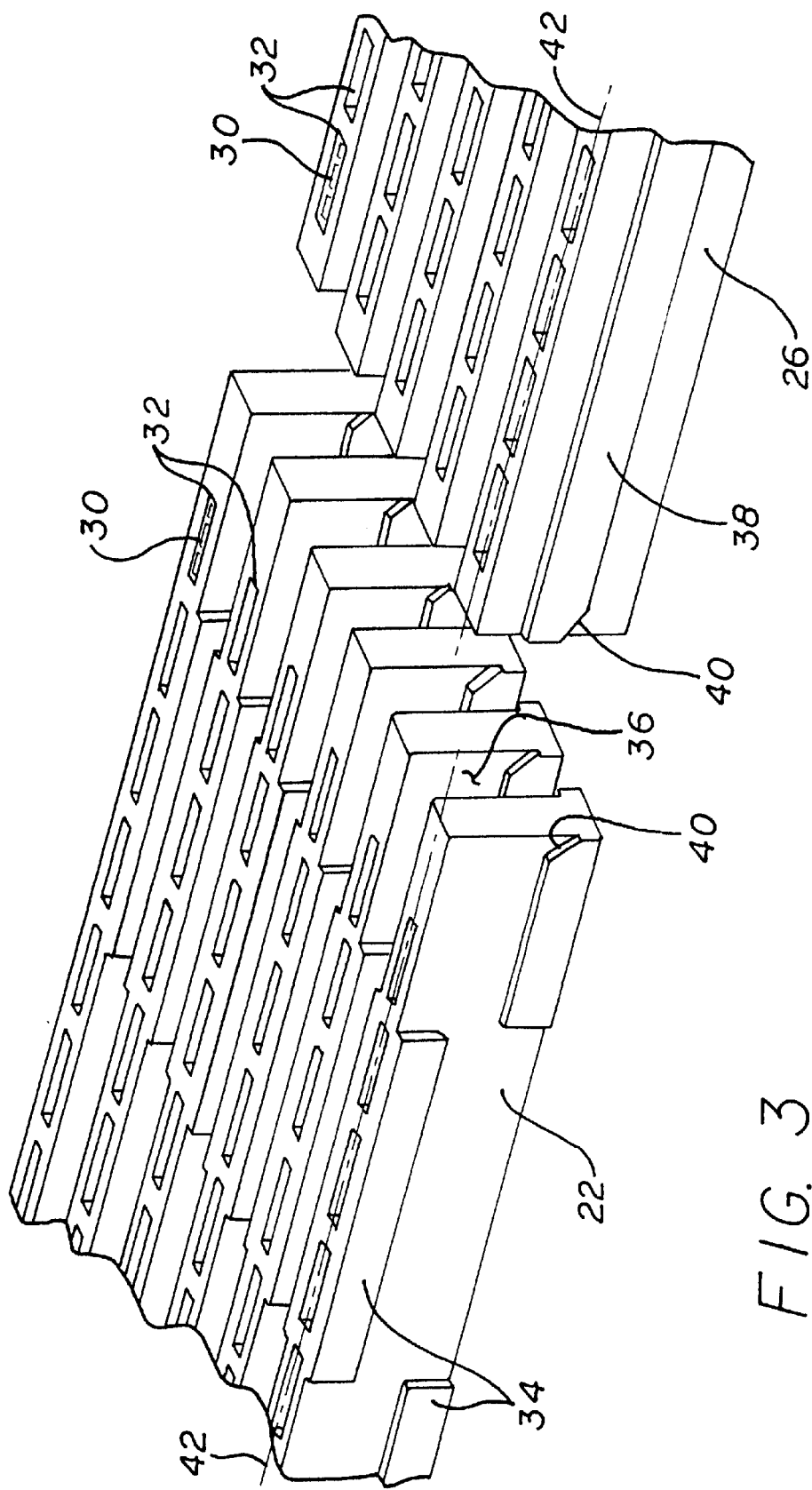
FIG. 3 is an enlarged perspective view showing a plurality of fingers of the socket.

As shown in FIGS. 2 and 3, the socket 12 may include a substrate 20 which has a plurality of first fingers 22 that extend from a first base 24 and a plurality of second fingers 26 that extend from a second base 28. Each finger 22 and 26 may contain a plurality of contacts 30 that are located within contact openings 32. The contacts 30 are adapted to receive the pins 18 of the integrated circuit package 16 shown in FIG. 1. The contacts 30 may be connected to the solder balls that are soldered to the printed circuit board 14.

Each first finger 22 may have a plurality of protruded areas 34 that form a slot 36. Each first finger 22 may have a slot 36 on each side of the finger 22. The slots 36 receive a corresponding tongue 38 formed in the second fingers 26 to interlock the fingers 22 and 26. The tongues 26 and outer protruded areas 34 may each have chamfered surfaces 40 that lead the second fingers 26 into the first fingers 22.

The fingers 22 and 26 can be formed from a molded fiber filled resin material. By way of example, the molded fiber filled resin material may be a fiberglass filled liquid crystal polymer ("LCP"). The fingers 22 and 26 may be molded or liquid crystal styrene ("LSC") so that the fibers are oriented in a direction that is essentially parallel with a longitudinal axis 42 of each finger 22 and 26. The coefficient of thermal expansion ("CTE") of the fingers along the longitudinal axis 42 is typically lower than the CTE normal to the axis 42. The CTE along the longitudinal axis approximates FR4 motherboard material.

Separating the socket substrate 20 into separate fingers 22 and 26 decreases the effective thermal expansion of the socket 12. It being understood that the amount of thermal expansion of the socket is a function of the expansion of each finger 22 and 26 pursuant to the equation:

$$\Delta L = \alpha \Delta T \cdot \frac{W}{2}$$

where;
α=the coefficient of thermal expansion;
ΔT=the change in temperature;
W=the width of a finger.

Figure 4:
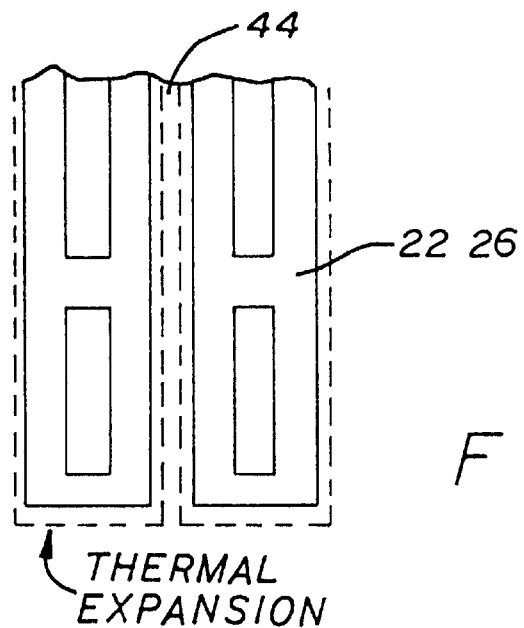
FIG. 4 is an enlarged top view showing spaces between adjacent fingers.

The thermal expansion of each finger 22 or 26 is about the center line of the finger 22 or 26. As shown in FIG. 4, the socket 12 may be constructed so that there are spaces 44 between the fingers 22 and 26. The spaces 44 allow adjacent fingers 22 and 26 to thermally expand, as indicated in phantom, without displacing the adjacent finger 22 or 26. Segmenting the socket into separate fingers may reduce or eliminate loads generated by the thermal expansion of the socket 12 relative to a non-segmented socket depending upon the temperature differential and the spaces between the fingers 22 and 26. The effective coefficient of thermal expansion in the direction normal to fiber orientation may be reduced to more closely approximate the CTE of the circuit board 14. Matching the CTE's of the circuit board 14 and socket 12 may reduce the stresses within the solder balls mounted to the board 14.

Referring to FIG. 2, the first base 24 may have a plurality of apertures 46 that receive corresponding protrusions 48 of the second base 28. The protrusions 48 may have an interference fit with the apertures 46 that prevents longitudinal movement of the fingers 22 and 26 when the socket 12 is assembled. The first base 24 and fingers 22 can be fastened to the second base 28 and fingers 26 with an adhesive, fasteners, or any other means.

Figure 5:
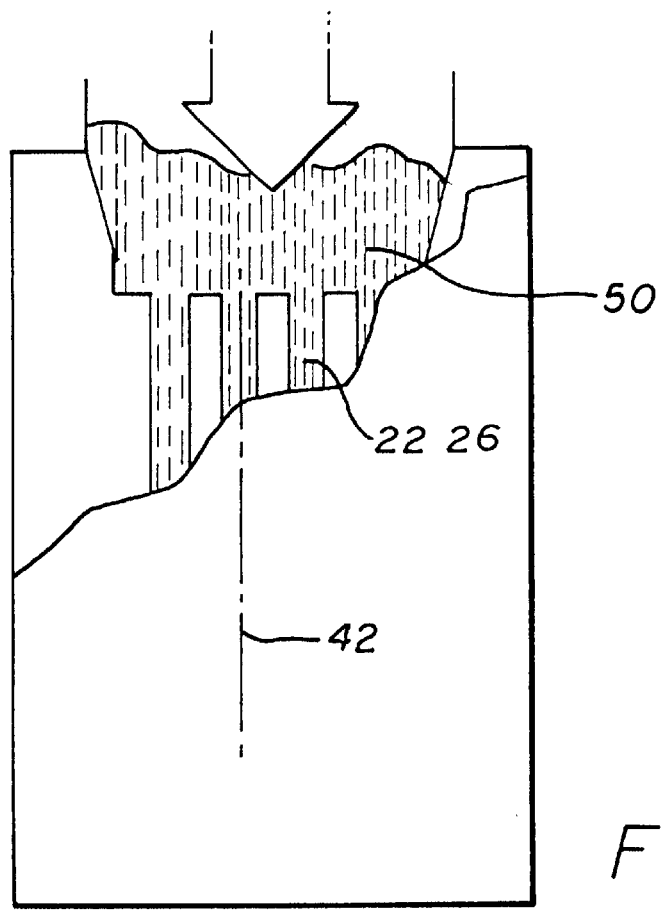
FIG. 5 is a top view showing a finger being molded.

FIG. 5 shows the fingers 22 or 26 being formed with an injection mold process. The fiber filled resin 50 may flow into a mold 52 in a direction essentially parallel with the longitudinal axis 42 of the resultant fingers 22 or 26. The fibers 50 will orient in the direction of resin flow. The socket will have a CTE along the longitudinal axis, and an effective CTE normal to the longitudinal axis, thereby providing a socket that has only two expansion directions. The present invention thus provides a process which increases the likelihood that the fibers are oriented in one direction and minimizes the thermal expansion of the resultant socket in a direction normal to fiber orientation.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art, such as having multiple rows of contacts per finger.

What is claimed is:

1. A socket for an electronic assembly, comprising:
  a plurality of interlocking fingers each having a plurality of contact openings, the plurality of interlocking fingers includes a first finger having a plurality of protruding areas forming a slot on a side surface of the first finger between a first protruding area adjacent to an edge of the top surface of the first finger and a second protruding area adjacent to an edge of a bottom surface of the first finger to receive a tongue portion from a second finger corresponding to and interlocking with the first finger; and
  a plurality of contacts placed within the plurality of contact openings and adapted to receive pins of an integrated circuit.

2. The socket of claim 1, wherein the plurality of contact openings associated with the plurality of interlocking fingers are placed on a top surface of the interlocking fingers.

3. The socket of claim 1, wherein each of the first and second fingers include a chamfered surface to lead the second finger into the first finger.

4. The socket of claim 1, wherein the plurality of interlocking fingers includes a first plurality of fingers extending from a first base and a second plurality of fingers extending from a second base, the first base having an aperture that receives a protrusion of the second base.

5. The socket of claim 1, wherein the first and second fingers are formed with fiber filled material having fibers that are oriented lengthwise along a longitudinal axis of each finger.

6. The socket of claim 1, wherein the tongue portion of the second finger is generally placed along a mid-point of a side surface of the second finger opposite the side surface of the first finger.

7. The socket of claim 6, wherein the socket is connected to a printed circuit board.

8. A socket for an electronic assembly, comprising:
  a first base;
  a first finger having a plurality of contacts openings and extending from the first base, the first finger includes a slot formed on a side surface of the first finger;
  a second base;
  a second finger having a plurality of contact openings and extending from the second base, the second finger including a tongue that interlocks with the slot of the first finger, the second finger being separated from the first finger by a space; and,
  a plurality of contacts placed within the plurality of contact openings of the first and second fingers and adapted to receive pins of an integrated circuit.

9. The socket of claim 8, wherein the first and second fingers are formed with fiber filled material having fibers that are oriented lengthwise along a longitudinal axis of each finger.

10. The socket of claim 8, wherein the slot of the first finger is formed between a first area protruding from the side surface and adjacent to an edge of a top surface of the first finger and a second area protruding from the side surface and adjacent to an edge of a bottom surface of the first finger.

11. The socket of claim 10, wherein the tongue of the second finger is placed along a mid-point of a side surface of the second finger opposite the side surface of the first finger.

12. The socket of claim 8, wherein the first base has an aperture that receives an insert of the second base.

13. The socket of claim 8 wherein the socket is connected to a printed circuit board.

14. A socket comprising:
  a first finger including a slot and a first plurality of contact openings, the slot being formed on a side surface of the first finger between a first protruding area that is adjacent to an edge of a top surface of the first finger and a second protruding area that is adjacent to an edge of a bottom surface of the first finger;
  a second finger including a second plurality of contact openings and a tongue, the second finger being positioned to face in a direction opposite the first finger for interlocking with the first finger by inserting the tongue of the second finger into the slot of the first finger; and a plurality of contacts placed within the first and second plurality of contact openings.

15. The socket of claim 14, wherein the first and second fingers each has a longitudinal axis and contains fibers that are oriented generally in parallel with the longitudinal axis.

16. The socket of claim 14, wherein each of the first and second fingers include a chamfered surface to lead the second finger into the first finger.

17. The socket of claim 14 further comprising (i) a first base including the first finger and at least one other finger extending from the first base, and (ii) a second base including the second finger and at least one other finger extending from the second base, the first base having an aperture that receives a protrusion of the second base.

18. The socket of claim 14, wherein the first and second fingers are formed with fiber filled material having fibers that are oriented lengthwise along a longitudinal axis of each finger.

19. The socket of claim 14, wherein the tongue of the second finger is generally placed along a mid-point of a side surface of the second finger opposite the side surface of the first finger.

* * * * *